United States Patent [19]

Boggs

[11] Patent Number: 4,935,584
[45] Date of Patent: Jun. 19, 1990

[54] METHOD OF FABRICATING A PRINTED CIRCUIT BOARD AND THE PCB PRODUCED

[75] Inventor: David W. Boggs, Hillsboro, Oreg.
[73] Assignee: Tektronix, Inc., Beaverton, Oreg.
[21] Appl. No.: 198,017
[22] Filed: May 24, 1988
[51] Int. Cl.⁵ .......................... H05K 3/36; H05K 1/00
[52] U.S. Cl. ................................. 174/262; 29/830; 174/263; 361/414
[58] Field of Search ............... 29/830, 852, 846, 848; 361/414; 174/68.5, 262, 263

[56] References Cited

U.S. PATENT DOCUMENTS

| | | | |
|---|---|---|---|
| 3,214,827 | 11/1965 | Phohofsky | 29/830 |
| 3,606,677 | 9/1971 | Ryan | 29/830 |
| 3,888,639 | 6/1975 | Hastings et al. | 29/830 |
| 4,371,744 | 2/1983 | Badet et al. | 174/68.5 |
| 4,566,186 | 1/1986 | Bauer et al. | 29/830 X |
| 4,620,264 | 10/1986 | Ushifusa et al. | 174/68.5 X |
| 4,640,010 | 2/1987 | Brown | 174/68.5 X |
| 4,642,160 | 2/1987 | Burgess | 29/852 X |
| 4,672,152 | 6/1987 | Shinohara et al. | 174/68.5 |
| 4,685,033 | 8/1987 | Inoue | 174/68.5 X |
| 4,721,831 | 1/1988 | Vora | 174/68.5 |
| 4,763,403 | 8/1988 | Klein et al. | 29/830 X |
| 4,803,450 | 2/1989 | Burgess et al. | 361/414 X |

FOREIGN PATENT DOCUMENTS 46-42261 12/1971 Japan ............................... 29/852

Primary Examiner—Carl E. Hall
Assistant Examiner—Carl J. Arbes
Attorney, Agent, or Firm—Boulden G. Griffith; John Smith-Hill

[57] ABSTRACT

A circuit board is fabricated from first and second composite sheets, each composed of a substrate of dielectric material and at least one conductor run adhered to the substrate. The substrate of the second composite sheet is formed with a through hole adjacent to the conductor run of that sheet. The second composite sheet is adhered to the first composite sheet, with the conductor run of the first sheet exposed through the hole in the second sheet. Conductive material is introduced into the hole and provides an electrically-conductive connection between the conductor runs of the two sheets.

15 Claims, 1 Drawing Sheet

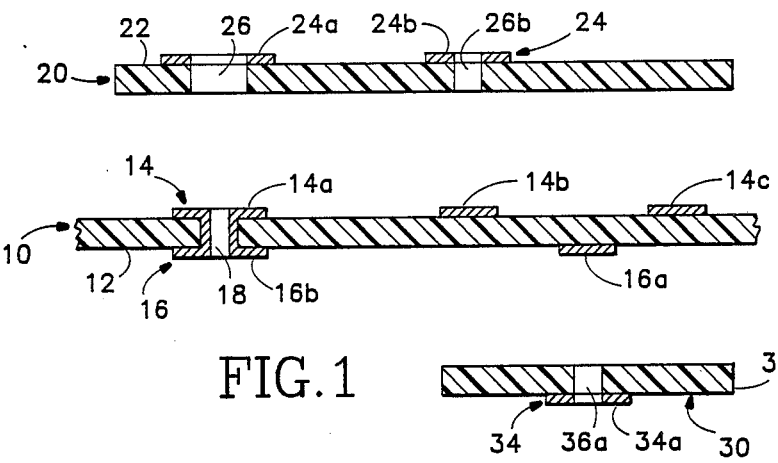
FIG. 1
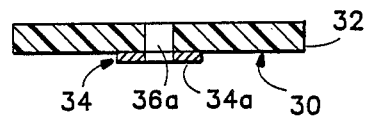
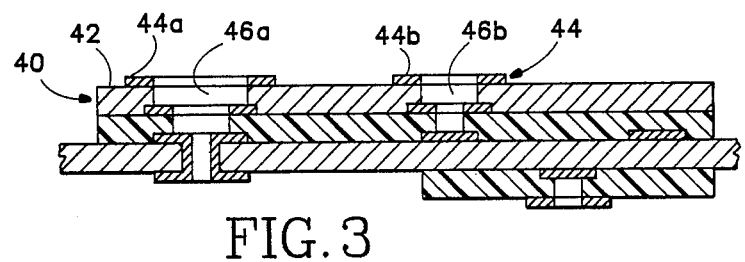
FIG. 2
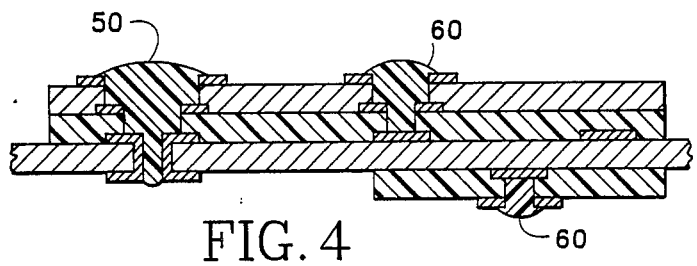
FIG. 3
FIG. 4

METHOD OF FABRICATING A PRINTED CIRCUIT BOARD AND THE PCB PRODUCED

BACKGROUND OF THE INVENTION

This invention relates to a method of fabricating a printed circuit board.

A multilayer printed circuit board may be fabricated from multiple composite sheets, each comprising a substrate of dielectric material and a foil of metal, such as copper, adhered to one surface of the substrate. The foil of a first composite sheet is patterned to define conductor runs of a first conductor layer, and the second sheet is then bonded to the first sheet so that the first conductor layer is covered by the second sheet and the foil of the second sheet is away from the first sheet. The two sheets may be bonded together under heat and pressure by use of a dry film adhesive. Holes are drilled through the assembly of the first and second sheets, and metal is deposited in these through holes by an electroless plating operation. The foil of the second sheet is then patterned, so as to define conductor runs of a second conductor layer, and the metal in the through holes provides electrically-conductive connection between runs of the first conductor layer and runs of the second conductor layer. This operation may be repeated until a board having five or more conductive layers is formed.

In a modification of the process described above, the first sheet has a copper foil adhered to each side, and each of these foils is patterned to form respective inner conductor layers. The two conductor layers of the first sheet are covered by respective composite sheets and the foils of these sheets are patterned (after drilling and through-hole plating) to define respective conductor layers. In this way, a so-called double-sided board is obtained.

The techniques described above may be applied to the manufacture of both rigid circuit boards, having substrates of, e.g. epoxy glass, and flexible circuit boards, having substrates of, e.g. polyimide.

The density of conductor runs required in a circuit board may be different in different areas of the board. The number of conductor layers will normally be determined by the maximum density of conductor runs, and therefore there may be large areas of the board having more conductor layers than are needed to provide the required density of conductor runs in those areas.

It is known to form a blind via during fabrication of a circuit board by locally removing the foil of the second sheet and then removing the dielectric material of the second sheet, where it has been exposed by local removal of the foil of the second sheet, without penetrating the first sheet. Metal is electrolessly deposited into the resulting blind hole, and the foil of the second sheet is then patterned. See U.S. Pat. No. 4,642,160, issued Feb. 10, 1987 (Burgess). Attention is also directed to U.S. Pat. Nos. 4,664,130, issued Feb. 17, 1987 (Bachman), 4,030,190, issued June 21, 1977 (Varker) and 4,566,186, issued Jan. 28, 1986 (Bauer et al).

SUMMARY OF THE INVENTION

A preferred embodiment of the present invention in a first aspect is a method of fabricating a circuit board, comprising providing first and second composite sheets, each composed of a substrate of dielectric material and at least one conductor run adhered to the substrate. The substrate of the second composite sheet is formed with a through hole adjacent to the conductor run of that sheet. The second composite sheet is adhered to the first composite sheet, with the conductor run of the first sheet exposed through the hole in the second sheet. Conductive material is introduced into the hole and provides an electrically-conductive connection between the conductor runs of the two sheets.

A preferred embodiment of the invention in a second aspect is a method of fabricating a circuit board, comprising providing an assembly of first and second composite sheets, each composed of a substrate of dielectric material and at least one conductor run adhered to the substrate. The substrate of the second composite sheet is formed with a through hole adjacent the conductor run of that sheet and the second composite sheet is positioned so that the conductor run of the first sheet is exposed through the hole in the second sheet and the conductor run of the second sheet is away from the first sheet. Conductive material is introduced into the hole and provides an electrically-conductive connection between the run of the first sheet and the run of the second sheet.

A preferred embodiment of the invention in a third aspect is an intermediate product for use in fabrication of a circuit board. The intermediate product is an assembly of first and second composite sheets, each composed of a substrate of dielectric material and at least one conductor run adhered to the substrate. The substrate of the second composite sheet is formed with a through hole adjacent the conductor run of that sheet and the second composite sheet is positioned so that the conductor run of the first sheet is exposed through the hole in the second sheet and the conductor run of the second sheet is away from the first sheet. The conductor run of the second sheet is electrically isolated from the conductor run of the first sheet.

A preferred embodiment of the invention in a fourth aspect is a circuit board comprising an assembly of first and second composite sheets, each composed of a substrate of dielectric material and at least one conductor run adhered to the substrate. The substrate of the second composite sheet is formed with a through hole adjacent the conductor run of that sheet and the second composite sheet is positioned so that the conductor run of the first sheet is exposed through the hole in the second sheet and the conductor run of the second sheet is away from the first sheet. The circuit board also comprises a conductive filler material in the through hole and providing an electrically-conductive connection between the conductor run of the first sheet and the conductor run of the second sheet. The conductive filler material is either (a) metal that melts at a temperature that is sufficiently low that exposure of the composite sheets to such temperature does not affect substantially the physical and electrical properties of the materials of the composite sheets, or (b) a metal-filled polymer material that is curable under conditions such that exposure of the composite sheets to such conditions does not affect substantially the physical and electrical properties of the materials of the composite sheets.

BRIEF DESCRIPTION OF THE DRAWINGS

For a better understanding of the invention, and to show how the same may be carried into effect, reference will now be made, by way of example, to the accompanying drawings in which, FIGS. 1–4 illustrate successive steps in fabrication of a multilayer printed circuit board.

DETAILED DESCRIPTION

A circuit board having different numbers of conductive layers in different areas is formed from a base composite sheet 10, which is made in conventional fashion and comprises a base substrate 12 having conductor layers 14 and 16 on opposite respective sides thereof. The conductor layer 14 includes conductor runs 14a, 14b and 14c and the conductor layer 16 includes conductor runs 16a and 16b. The conductor run 14a is connected to the conductor run 16a by means of a via formed by drilling a hole 18 through the sheet 10 and introducing conductive material into the hole. For example, metal may be introduced into the hole by an electroless plating operation, or polymer thick film material may be introduced by a screening process. The area of each conductor run is small in relation to the area of the substrate to which it is adhered.

A second composite sheet 20 comprising a substrate 22 and a conductor layer 24, including conductor runs 24a and 24b, is also made in conventional fashion. Holes 26a and 26b, which are drilled through the sheet 20, intercept the conductor runs 24a and 24b respectively. The sheet 20 is then bonded to the sheet 10 under heat and pressure using a liquid adhesive that is applied to the sheet 20. The holes 26a and 26b lie immediately over the conductor runs 14a and 14b respectively. The adhesive is preferably a no-flow adhesive, i.e., an adhesive that does not readily flow when the sheets 20 are bonded together, and may be an acrylic or epoxy free-film adhesive. A third composite sheet 30, comprising a substrate 32 and a conductor layer 34, including a conductor run 34a, is manufactured in conventional fashion, and a hole 36a is drilled through the sheet 30 in a location such that it intercepts the conductor run 34a. The sheet 30 is bonded to the lower surface of the sheet 10 in a position such that the hole 36a is bounded by the conductor run 16a.

A fourth composite sheet 40, comprising a substrate 42 and a conductor layer 44, including conductor runs 44a and 44b, is manufactured, and holes 46a and 46b are drilled in the sheet 40 at locations such that they intercept the runs 44a and 44b respectively. The sheet 40 is bonded to the sheet 20 in a position such that the holes 46a and 46b are aligned with the holes 26a and 26b. Molten solder 50 is introduced into the hole 46a. The solder fills the holes 26a and 46a, and may also penetrate the hole 18 defined by the through-hole plated via in the sheet 10. The solder solidifies and bonds to the conductor runs 14a, 24a and 44a, so that these conductor runs are connected together in electrically-conductive fashion. The melting temperature of the solder is sufficiently low that exposure of the composite sheets to the molten solder does not adversely affect the physical and electrical properties of the assembly of composite sheets. Similarly, solder 60 is introduced into the hole 46b and provides an electrically-conductive connection between the runs 14b, 24b and 44b, and is introduced into the hole 36a and connects the runs 16a and 34a.

Because the holes 46a and 46b are larger than the holes 26a and 26b, the solder that is introduced into the holes is able to contact each conductor run on two surfaces (its inner periphery and its top surface). Moreover, even if there should be slight misalignment of the sheets, voids that might trap contaminants will not be formed when the solder is introduced into the holes.

It will be seen that use of the method described above allows a circuit board to be fabricated with different numbers of conductor layers in different regions.

It will be appreciated that the present invention is not restricted to the particular embodiment that has been described, and that variations may be made therein without departing from the scope of the invention as defined in the appended claims and equivalents thereof. In particular, the invention is not limited to use of solder as the conductive filler, and other materials that have a fluid state and a non-fluid state may be used. For example, a copper or silver filled epoxy material may be introduced into the holes in the uncured state and then cured, provided that the conditions required for curing the epoxy material are such that exposure of the assembly of composite sheets to these conditions does not adversely affect the physical and electrical properties of the assembly. Also, the invention is not restricted to the circuit board having a particular number of composite sheets.

I claim:

1. A method of fabricating a circuit board, comprising the following steps (a), (b) and (c) in the order stated:
    (a) providing first, second and third composite sheets, each composed of a substrate of dielectric material and at least one conductor run adhered to the substrate, the substrates of the second and third composite sheets each being formed with a through hole and the through hole in the third sheet being adjacent the conductor run of that sheet,
    (b) bonding the second composite sheet to the first composite sheet, with the conductor run of the first sheet exposed through the hole in the second sheet and the conductor run of the second sheet away from the first sheet, and bonding the third composite sheet to the second composite sheet, with the conductor run of the third sheet away from the second sheet, the through hole in the third sheet in communication with the through hole in the second sheet, and the first sheet obstructing the holes in the second and third sheets whereby a blind hole passing through the first and second sheets is formed in the circuit board, and
    (c) introducing conductive material into the blind hole, thereby providing an electrically-conductive connection between the run of the first sheet and the run of the third sheet.

2. A method according to claim 1, wherein the cross-sectional area of the through hole in the third sheet is greater than the cross-sectional area of the through hole in the second sheet, and step (b) comprises positioning the second and third sheets so that the through holes in the respective sheets are substantially in alignment, whereby the blind hole is of stepped configuration.

3. A method according to claim 1, wherein the conductive material that is introduced in step (c) is a molten metal, and the method further comprises allowing the molten metal to solidify.

4. A method according to claim 1, wherein the conductive material that is introduced in step (c) is a metal-filled curable polymer material, and the method further comprises curing the polymer material.

5. A method according to claim 1, wherein the hole in the second sheet is adjacent the conductor run of that sheet, whereby the conductive material in the holes in the second and third sheets provides an electrically-conductive connection among the runs of the first, second and third sheets.

6. A method according to claim 1, wherein said second sheet has a length and said third sheet is coextensive with a portion of the length of said second composite sheet, said portion being shorter than the length of said second sheet.

7. A method according to claim 1, wherein step (b) comprises positioning the second and third sheets so that the through holes in the respective sheets are substantially in alignment.

8. A method of fabricating a circuit board, comprising the following steps (a) and (b) in the order stated:
   (a) providing an assembly of first, second and third composite sheets, each composed of a substrate of a dielectric material and at least one conductor run adhered to the substrate, the substrates of the second and third composite sheets each being formed with a through hole, the through holes being substantially in alignment and being obstructed by the first sheet whereby a blind hole is formed in the circuit board, the through hole in the third sheet being adjacent the conductor run of that sheet and the second and third composite sheets being positioned so that the conductor run of the first sheet is exposed through the blind hole, the conductor run of the second sheet is away from the first sheet, and the conductor run of the third sheet is away from the second sheet, and
   (b) introducing conductive material into the blind hole, the conductive material providing an electrically-conductive connection between the run of the first sheet and the run of the third sheet.

9. A method according to claim 8, wherein the conductive material that is introduced in step (b) is a molten metal, and the method further comprises allowing the molten metal to solidify.

10. A method according to claim 8, wherein the conductive material that is introduced in step (b) is a metal-filled curable polymer material, and the method further comprises curing the polymer material.

11. A method according to claim 8, wherein the cross-sectional area of the through hole in the third sheet is greater than the cross-sectional area of the through hole in the second sheet, whereby the blind hole has a stepped configuration.

12. An article of manufacture comprising an assembly of first, second and third composite sheets, each composed of a substrate of dielectric material and at least one conductor run adhered to the substrate, the substrates of the second and third composite sheets each being formed with a through hole, the through holes being in alignment and being obstructed by the first sheet whereby a blind hole is formed in the article, the through hole in the third sheet being adjacent the conductor run of that sheet, and the second and third composite sheets being positioned so that the conductor run of the first sheet is exposed through the blind hole, the conductor run of the second sheet is away from the first sheet, and the conductor run of the third sheet is away from the second sheet, and the article also comprising a unitary body of conductive filler material in the blind hole and providing an electrically-conductive connection between the conductor run of the first sheet and the conductor run of the third sheet, the conductive filled material being selected from the group consisting of (a) metals that melt at a temperature that is sufficiently low that exposure of the composite sheets to such temperature does not affect substantially the physical and electrical properties of the materials of the composite sheets, and (b) metal-filled polymer materials that are curable under conditions such that exposure of the composite sheets to such conditions does not affect substantially the physical and electrical properties of the materials of the composite sheets.

13. An article according to claim 12, wherein the through hole in the second sheet is adjacent the conductor run of that sheet, whereby the conductive material in the blind hole provide an electrically-conductive connection among the runs of the first, second and third sheets.

14. An article according to claim 12, wherein the cross-sectional area of the through hole in the third sheet is greater than the cross-sectional area of the through hole in the second sheet, whereby the blind hole has a stepped configuration.

15. An article according to claim 12, wherein the hole in the second sheet is adjacent the conductor run of that sheet, whereby the conductive material in the blind hole provides an electrically-conductive connection among the runs of the first, second and third sheets.

* * * * *